United States Patent [19]
Nepela et al.

[11] Patent Number: 5,742,162
[45] Date of Patent: Apr. 21, 1998

[54] MAGNETORESISTIVE SPIN VALVE SENSOR WITH MULTILAYERED KEEPER

[75] Inventors: Daniel A. Nepela, San Jose; Marcos M. Lederman, San Francisco, both of Calif.

[73] Assignee: Read-Rite Corporation, Milpitas, Calif.

[21] Appl. No.: 682,276

[22] Filed: Jul. 17, 1996

[51] Int. Cl.$^6$ .............................. G01R 33/09; H01L 43/08
[52] U.S. Cl. ................................. 324/252; 338/32 R
[58] Field of Search ............... 324/207.21, 252; 338/32 R; 360/113; 365/158; 428/611

[56] References Cited

U.S. PATENT DOCUMENTS

| | | | |
|---|---|---|---|
| 5,018,037 | 5/1991 | Kroubi et al. | 360/113 |
| 5,206,590 | 4/1993 | Dieny et al. | 324/252 |
| 5,287,238 | 2/1994 | Baumgart et al. | 324/252 X |
| 5,508,867 | 4/1996 | Cain et al. | 324/252 X |
| 5,583,725 | 12/1996 | Coffey et al. | 324/252 X |

*Primary Examiner*—Gerard R. Strecker
*Attorney, Agent, or Firm*—Nathan N. Kallman

[57] ABSTRACT

A magnetic sensing structure includes a spin valve sensor having a pinned magnetic layer and a free magnetic layer, the direction of magnetization of the free layer varying as a function of the magnetic field applied to the structure. A multilayered magnetic keeper structure is provided to cancel the magnetostatic field from the pinned layer to provide an ideal bias profile for the structure in the absence of an applied magnetic field. Longitudinal magnetic bias may be applied to the spin valve sensor through a contiguous junction magnetic structure adjacent to the keeper structure and spin valve sensor.

7 Claims, 4 Drawing Sheets

MAGNETORESISTIVE SPIN VALVE SENSOR WITH MULTILAYERED KEEPER

FIELD OF THE INVENTION

This invention relates to thin film magnetic sensors and in particular to improved magnetoresistive spin valve sensors employing keeper layers.

DESCRIPTION OF THE PRIOR ART

U.S. Pat. No. 5,206,590, Dieny et al, describes a magnetoresistive (MR) sensor utilizing the spin valve effect. The sensor comprises a rectangular multilayered structure deposited on a suitable substrate. The multilayered structure includes a "free" layer of soft magnetic material and a "pinned" magnetic layer in which the magnetization is pinned or fixed in a direction parallel to the width of the sensor. The pinning is accomplished either by the use of a hard magnetic material as the first layer, or by use of an antiferromagnetic layer to pin the first layer by exchange coupling. The free and the pinned layers are separated by a thin nonmagnetic metallic spacer layer, such as copper. The magnetization of the free layer is normally in a direction along the length of the sensor, but is free to rotate therefrom in a positive or negative transition direction through an angle determined by the magnitude of the magnetic field being sensed.

The change in resistance in a spin valve structure is a function of the change in the angle between the directions of the magnetization in the two magnetic layers (i.e., the free layer and the pinned layer). The change in resistance of this multilayered structure relative to a constant background value is proportional to $\sin \theta$ averaged over the height of the sensor, where $\theta$ is the angle of the magnetization in the free layer with respect to the longitudinal axis of the sensor. Because the resistance change is proportional to $\sin \theta$, the signal produced by the sensor will be linear throughout the applied field for small field values. However, the sensor output becomes nonlinear when the free layer is magnetically saturated during a positive or negative excursion of the applied field and thus limits the peak-to-peak signal that can be produced by the sensor.

The ideal quiescent magnetic state for the sensor is achieved when $\theta=0$ over the entire height of the free layer. This ideal quiescent state is that which is furthest from magnetic saturation under both positive and negative field excitations. It generates an ideal bias profile that maximizes the linear dynamic range to provide a larger signal output and improved linearity. However, this ideal bias profile cannot be achieved with many spin valve structures because of the flux coupling between the pinned layer and the free layer and because of the magnetic field produced by the current flowing through and normal to the various layers of the spin valve structure. The transfer curve of FIG. 1 illustrates this lack of an ideal bias profile in such prior art devices, with the curve being offset from the intersection of the resistance change $\Delta R$ axis and the applied magnetic field H axis, where $\Delta R$ is the change of resistance of a spin valve sensor as a function of applied magnetic field.

U.S. Pat. No. 5,508,867, Cain et al, describes a structure proposed to solve this ideal bias profile problem. Cain et al shows an MR sensing system with a layered spin valve structure including thin first and second layers of ferromagnetic material separated by a thin layer of nonmagnetic metallic material. The magnetization direction of the first or free layer at a zero applied magnetic field is substantially parallel to the longitudinal dimension of the MR sensor and substantially perpendicular or orthogonal to the fixed or pinned magnetization direction of the second layer. A single thin keeper layer of a high coercivity ferromagnetic material is separated by a thin spacer layer from the layered spin valve structure. This keeper layer has a fixed magnetization direction substantially opposite that of the second layer, and has a moment thickness product substantially equal to that of the second layer, for cancelling the magnetostatic field from the second layer. A current flow is produced through the MR sensor to produce a magnetic field of a sign and magnitude which cancels the ferromagnetic exchange coupling between the first and second layers.

SUMMARY OF THE PRESENT INVENTION

A thin film spin valve structure utilizes a multilayered keeper structure including alternating ferromagnetic (FM) layers and antiferromagnetic (AFM) layers. The multilayer keeper structure has a fixed magnetization direction which is opposite to the magnetization direction of the pinned layer of the spin valve. The multilayer keeper structure thus generates the same magnitude of magnetostatic field on the free magnetic layer as does the pinned layer, so that the net magnetostatic field on the free magnetic layer is zero in the absence of an external magnetic field. Under these conditions, the spin valve is perfectly biased magnetically.

In the preferred embodiment, the spin valve structure is provided with magnetic biasing in the form of a contiguous junction biasing structure located on each side of the spin valve sensor and the multilayered keeper structure. The use of the contiguous junction structure provides hard longitudinal bias to the spin valve sensor for suppression of Barkhausen noise. The use of such contiguous junction hard bias is not feasible in the structure of the Cain et al reference discussed above because the direction of magnetization of the permanent magnet keeper of Cain et al would be orthogonal to the direction of magnetization of the contiguous junction longitudinal bias permanent magnet, so that initializing one permanent magnet would de-initialize the other magnet. Since it is desirable to provide longitudinal bias in a spin valve sensor, the present invention represents a distinct advantage over the prior art.

DESCRIPTION OF THE PREFERRED EMBODIMENTS

Figure 3:
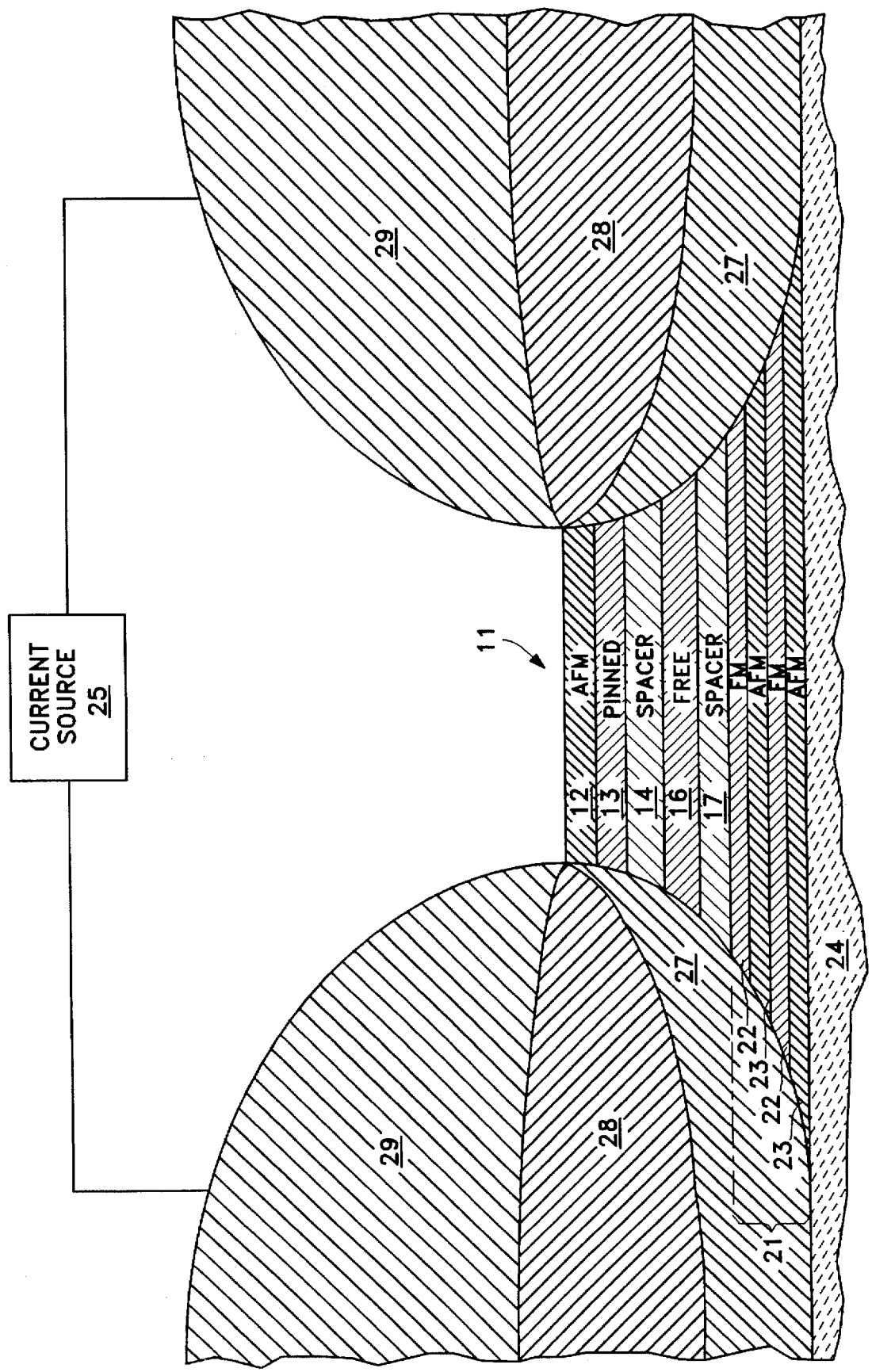
FIG. 3 is a partial cross-sectional view of one embodiment of a spin valve sensor with a contiguous junction longitudinal biasing structure in accordance with the present invention.

FIG. 3 shows one embodiment of a spin valve sensor structure 11 which includes an AFM layer 12 such as FeMn or any other Mn-based antiferromagnetic material, a pinned magnetic layer 13 such as NiFe, a metallic spacer layer 14 such as copper, a magnetic free layer 16 such as NiFe, and a spacer layer 17 such as Ta. The above described component layers form the spin valve portion of the sensor structure and operate in a conventional manner. That is, the direction of magnetization of pinned layer 13 is fixed perpendicular to the length of the sensor by exchange coupling with AFM layer 12, while the magnetization direction of free layer 16 varies a function of the strength and direction of the magnetic field applied to the sensor.

The sensor of FIG. 3 also includes a multilayered magnetic keeper structure 21 in accordance with this invention. The multilayer keeper of FIG. 3, in its preferred embodiment, is made of layers 22 of soft FM material such as NiFe or CoFe alternating with layers 23 of AFM material such as FeMn (or other Mn-based antiferromagnetic material), NiO or NiCoO. Lower AFM layer 23 is deposited on a suitable substrate 24.

Figure 1:
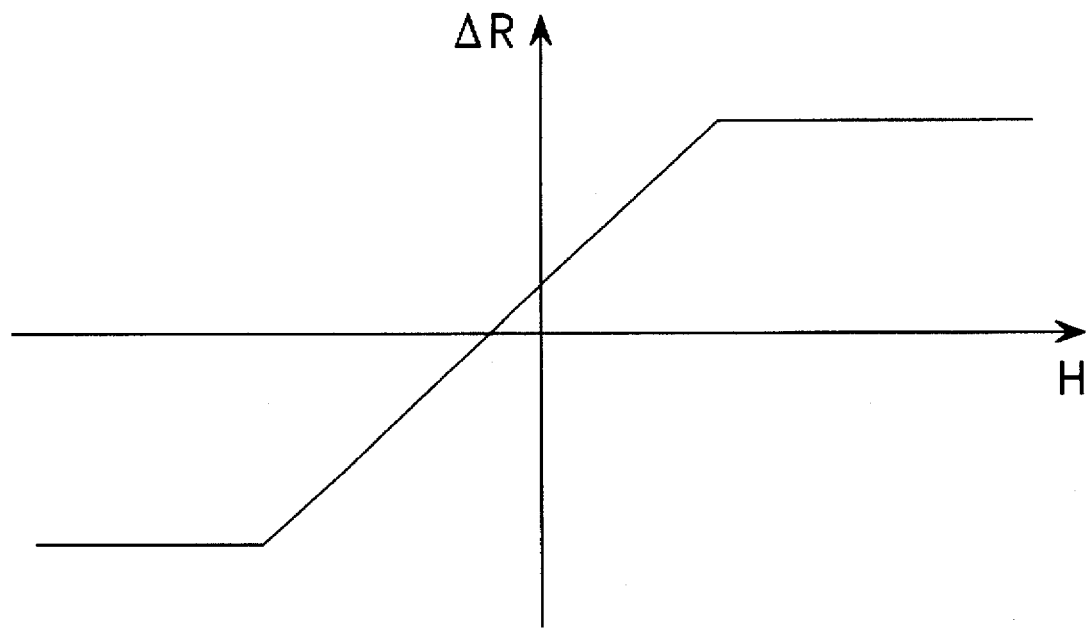
FIG. 1 is a graph of the resistance change $\Delta R$ of a spin valve sensor as a function of the strength of the applied magnetic field H for an unbiased prior art sensor.
Figure 2:
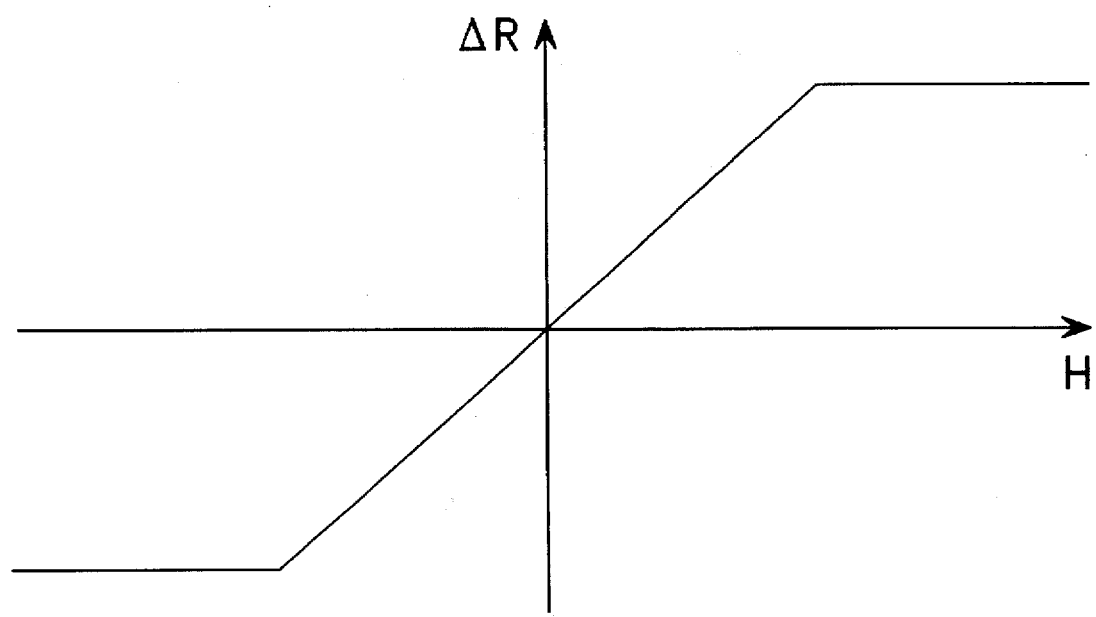
FIG. 2 is a graph of sensor resistance change $\Delta R$ as a function of applied magnetic field strength H for a spin valve sensor in accordance with the present invention.

The multilayer keeper structure 21 has a fixed magnetization direction which is opposite to the magnetization direction of pinned layer 13 in the spin valve sensor. Keeper structure 21 generates the same magnitude of magnetostatic force on free layer 16 of the spin valve sensor as does pinned layer 13, thereby resulting in zero magnetostatic force on free layer 16 in the absence of an applied external magnetic field. This produces a perfectly balanced bias profile, as shown by the transfer curve of FIG. 2.

AFM layer 12 requires a substantially different blocking temperature than the blocking temperature of AFM layer 23 so that the pinning directions of the materials of AFM layers 12 and 23 can be made to be anti-parallel to each other. In order to properly initialize the AFM materials, the temperature is raised above the highest blocking temperature in the presence of an external magnetic field H in the proper direction. The temperature is then lowered to an intermediate value between the two blocking temperatures, and the field H is rotated by 180°. Finally, the temperature is lowered to room temperature in the presence of H.

For optimum performance, the multilayered keeper/spin valve sensor is provided with longitudinal magnetic hard bias for the control of Barkhausen noise. Preferably, this longitudinal bias is provided by means of a contiguous junction hard magnetic bias structure such as that of the type shown in U.S. Pat. No. 5,018,037, Krounbi et al, which reference is incorporated herein by reference. This longitudinal hard bias shown in FIG. 3 includes a layer 27 such as Cr overlaid by a layer 28 such as CoCrPt, which in turn is overlaid by an electrically conductive lead layer 29. Sense current is supplied from a current source 25 through lead layers 29 on each side of the spin valve/keeper structure to the spin valve sensor element. As is well known in the art, shield members (not shown) may be employed to minimize the effects of stray magnetic flux which would reduce the resolution of the readback signal, and insulating layers can be utilized between these shield members and the active members of the sensor.

As discussed above, the use of such a contiguous junction longitudinal bias structure is possible with the multilayer keeper structure of this invention, but would not be feasible with the single layer permanent magnet keeper element of the cited Cain et al reference.

Figure 4:
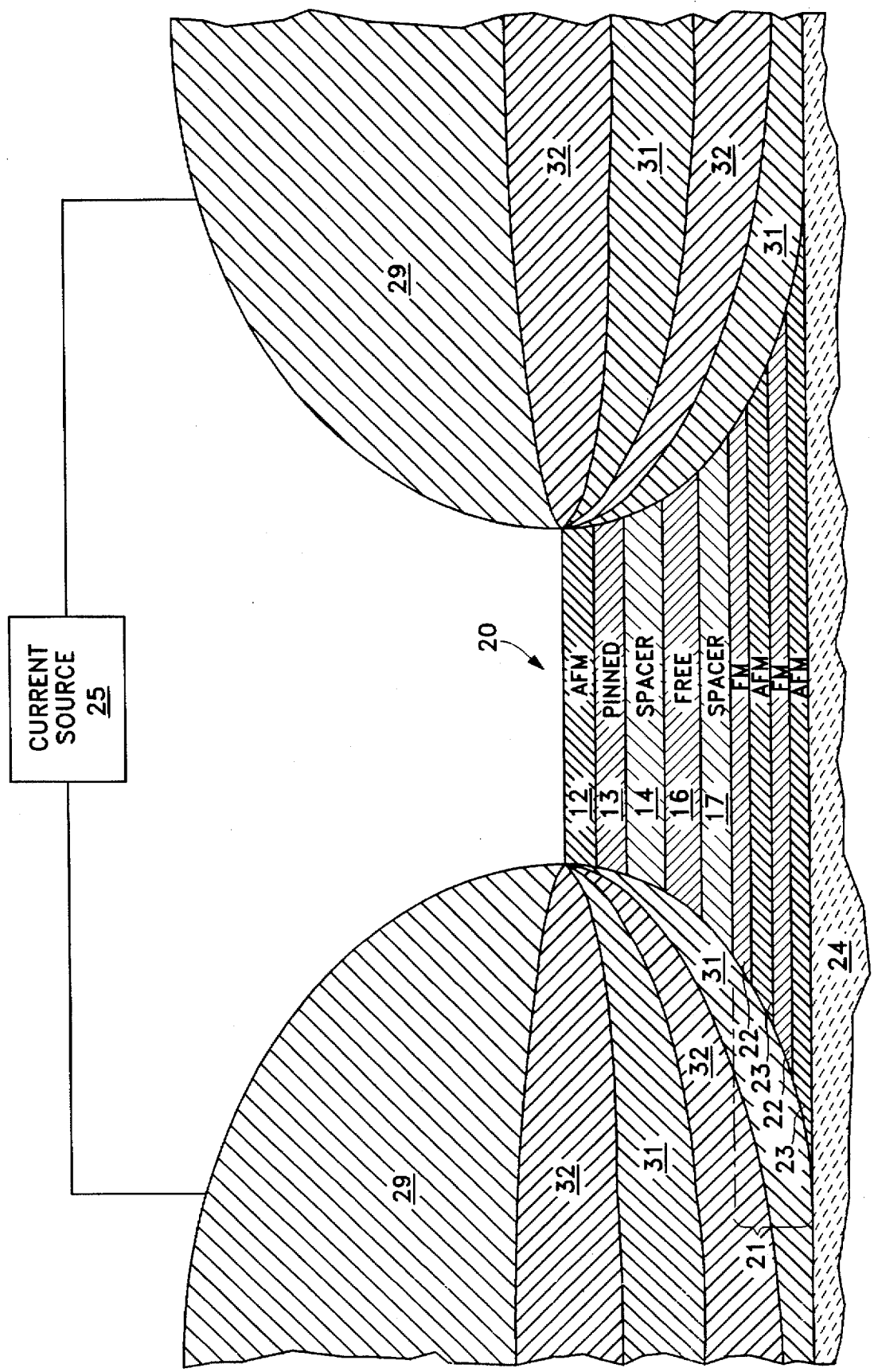
FIG. 4 is a partial cross-sectional view of an additional embodiment of the invention utilizing a different structure for contiguous junction longitudinal biasing.

FIG. 4 illustrates a further configuration of a spin valve sensor structure 20 embodying the invention and employing a contiguous junction longitudinal bias structure different from that shown in FIG. 3. In FIG. 4, the spin valve structure and multilayer keeper structure are the same as those elements in the embodiment of FIG. 3. The contiguous junction bias structure comprises layers 31 of Cr, alternating with layers 32 of a permanent magnetic material such as CoCrPt or CoCrPd. The top layer 32 is overlaid by a conductive lead layer 29 similar in function and composition to lead layer 29 in FIG. 3 and connected to current source 25.

Figure 5:
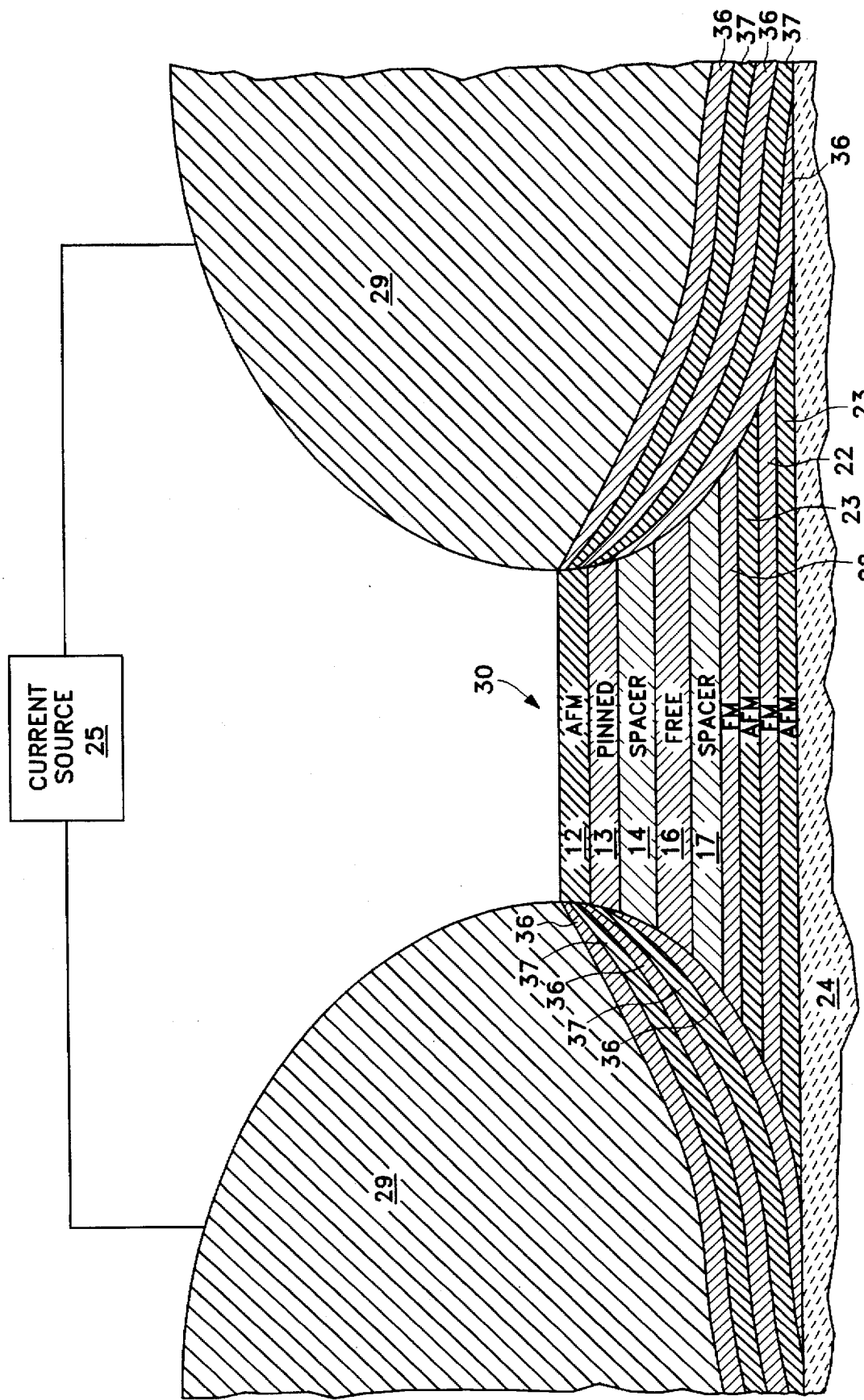
FIG. 5 is a partial cross-sectional view of a further embodiment of the invention employing a still different structure for contiguous junction longitudinal biasing.

FIG. 5 shows a further configuration of structure 30 embodying the invention and utilizing a contiguous junction longitudinal bias structure different from those shown in FIGS. 3 and 4. In FIG. 5, the contiguous junction longitudinal bias structure includes layers of FM material 36 alternating with layers of AFM material 37. The upper layer 36 of antiferromagnetic material is overlaid by a lead layer 29 similar in function and composition to lead layer 29 of FIGS. 3 and 4 and connected to current source 25.

As a further feature of the invention, the entire structure of each of the embodiments may be capped with a protective layer of a high resistivity material such as Ta.

What is claimed is:

1. A magnetic sensing structure comprising:

a layered spin valve sensor including first and second layers of ferromagnetic material separated by a layer of nonmagnetic metallic conductive material, said second layer of ferromagnetic material having a fixed direction of magnetization, the magnetization direction of said first layer at a zero applied magnetic field being substantially parrallel to the longitudinal axis of said spin valve sensor and substantially perpendicular to said fixed magnetization direction of said second layer;

said magnetization direction of said first layer rotating in response to variations in the magnitude of said applied field;

a multilayer magnetic keeper structure separated from said layered spin valve sensor by a spacer layer of high resistivity material, said multilayer magnetic keeper structure having a fixed magnetization direction substantially anti-parallel to said fixed direction of said magnetization of said second layer; and a magnetic biasing structure magnetically coupled through a contiguous junction to said layered spin valve sensor and said multilayer magnetic keeper structure to provide longitudinal magnetic bias to said spin valve sensor.

2. A magnetic sensing structure in accordance with claim 1 in which said multilayer magnetic keeper structure includes layers of ferromagnetic material alternating with layers of antiferromagnetic material.

3. A magnetic sensing structure in accordance with claim 2 in which said ferromagnetic layers of said keeper structure are of NiFe, Co, CoFe, or any other soft high moment magnetic alloy, and said antiferromagnetic layers of said keeper structure are of a manganese-based antiferromagnetic material, NiO or NiCoO.

4. A magnetic sensing structure in accordance with claim 2 including:

a layer of a first antiferromagnetic material in said layered spin valve sensor for magnetically pinning said second ferromagnetic layer, said layers of antiferromagnetic material in said multilayer keeper structure having a different blocking temperature than the blocking temperature of said first antiferromagnetic material.

5. A magnetic sensing structure in accordance with claim 1 in which said magnetic biasing structure includes alternating layers of ferromagnetic material and antiferromagnetic material.

6. A magnetic sensing structure in accordance with claim 1 in which said magnetic biasing structure includes adjacent layers of Cr, CoCrPt, CoCrPd or other suitable high coercivity material.

7. A magnetic sensing structure in accordance with claim 1 in which said magnetic biasing structure includes alternating layers of Cr and a permanent magnet material.

* * * * *